United States Patent
Matsumoto

(10) Patent No.: US 9,648,761 B2
(45) Date of Patent: May 9, 2017

(54) COVER

(71) Applicant: YAZAKI CORPORATION, Minato-ku, Tokyo (JP)

(72) Inventor: Yusuke Matsumoto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 71 days.

(21) Appl. No.: 14/587,431

(22) Filed: Dec. 31, 2014

(65) Prior Publication Data
US 2015/0114679 A1 Apr. 30, 2015

Related U.S. Application Data

(63) Continuation of application No. PCT/JP2013/067798, filed on Jun. 28, 2013.

(30) Foreign Application Priority Data

Jul. 6, 2012 (JP) .................. 2012-152438

(51) Int. Cl.
H05K 5/00 (2006.01)
B60R 16/02 (2006.01)
F16B 41/00 (2006.01)
F16B 31/04 (2006.01)

(52) U.S. Cl.
CPC ........... *H05K 5/0008* (2013.01); *B60R 16/02* (2013.01); *F16B 41/002* (2013.01); *F16B 31/04* (2013.01)

(58) Field of Classification Search
CPC ... H01R 4/38; H02G 3/16; H05K 5/03; H05K 5/0008
USPC .......................................... 174/559
See application file for complete search history.

(56) References Cited

U.S. PATENT DOCUMENTS 4,952,171 A * 8/1990 Sugiyama ............ H01R 11/284
174/138 F
2002/0134572 A1* 9/2002 Matsumura .......... H01H 85/044
174/66

FOREIGN PATENT DOCUMENTS

| JP | H06-4421 U | | 1/1994 | |
| JP | H06-4421 | * | 1/1996 | ............... H02G 3/16 |
| JP | 2002-289171 A | | 10/2002 | |
| JP | 2003-009351 | * | 1/2003 | ............... H02G 3/16 |
| JP | 2003-009351 A | | 1/2003 | |
| JP | 2006-339206 A1 | | 12/2006 | |

OTHER PUBLICATIONS

Office Action issued on Dec. 7, 2016 in the counterpart German patent application.

* cited by examiner

Primary Examiner — Jenny L Wagner
Assistant Examiner — Michael E Moats, Jr.
(74) Attorney, Agent, or Firm — Mots Law, PLLC

(57) ABSTRACT

A cover covers a fuse unit to which a terminal is fixed in a manner such that a nut is fastened onto a bolt placed with the tip thereof facing outward. The cover is provided, on the inner surface thereof in a position corresponding to the nut, with a protrusion having a height set in a manner such that the protrusion does not interfere with the nut located in a fastened position, but interferes with the nut located in another position other than the fastened position. A thin portion is formed on the circumference of the protrusion.

14 Claims, 7 Drawing Sheets

COVER

CROSS REFERENCE TO RELATED APPLICATION

This is a continuation application based on PCT application No. PCT/JP2013/067798 filed on Jun. 28, 2013, which claims the benefit of priority from Japanese Patent Application No. 2012-152438 filed on Jul. 6, 2012, the entire contents of which are incorporated by reference herein.

BACKGROUND OF THE INVENTION

1. Field of the Invention

The present invention relates to a cover covering an electronic device installed in a vehicle or the like.

2. Description of the Related Art

A fuse unit, for example, directly attached to a battery of a vehicle is widely known (for example, refer to Japanese Unexamined Patent Application Publication No. 2002-289171).

As one example of the fuse unit, there has been known a fuse unit to which a terminal is fixed in a manner such that a nut is fastened onto a bolt placed with a tip thereof facing upward. Such a fuse unit is generally covered with a cover for insulating and protecting the bolt, nut and terminal serving as electric conductive members of the fuse unit.

Here, the use of a configuration in which a nut is temporarily fixed onto a bolt, contributes to improving fastening workability.

When the configuration in which a nut is temporarily fixed onto a bolt is used, however, there is a risk of an omission of complete fastening of the nut at the time of attaching the cover to the fuse unit.

SUMMARY OF THE INVENTION

The present invention has been made in view of the above-described conventional problem. An object of the present invention is to provide a cover capable of preventing an omission of fastening of a nut for fixing a fixture component to an electronic device.

The present invention provides a cover covering an electronic device to which a fixture component is fixed in a manner such that a nut is fastened onto a bolt placed with a tip of a screw portion facing outward. The cover includes a protrusion formed on the inner surface of the cover in a position corresponding to the nut and having a height set in a manner such that the protrusion does not interfere with the nut located in a fastened position, but interferes with the nut located in another position other than the fastened position, and a thin portion formed on a circumference of the protrusion.

According to the present invention, the protrusion located on the inner surface of the cover in the position corresponding to the nut does not interfere with the nut at the time of attaching the cover to the electronic device when the nut is appropriately fastened onto the bolt of the electronic device. When the nut is not completely fastened to the bolt of the electronic device, on the other hand, the protrusion interferes with the nut so that the thin portion formed on the circumference of the protrusion is subjected to stretch deformation and whitened. Accordingly, an omission of fastening of the nut for fixing a fixture component to the electronic device can visually be recognized.

DESCRIPTION OF THE EMBODIMENTS

Figure 1:
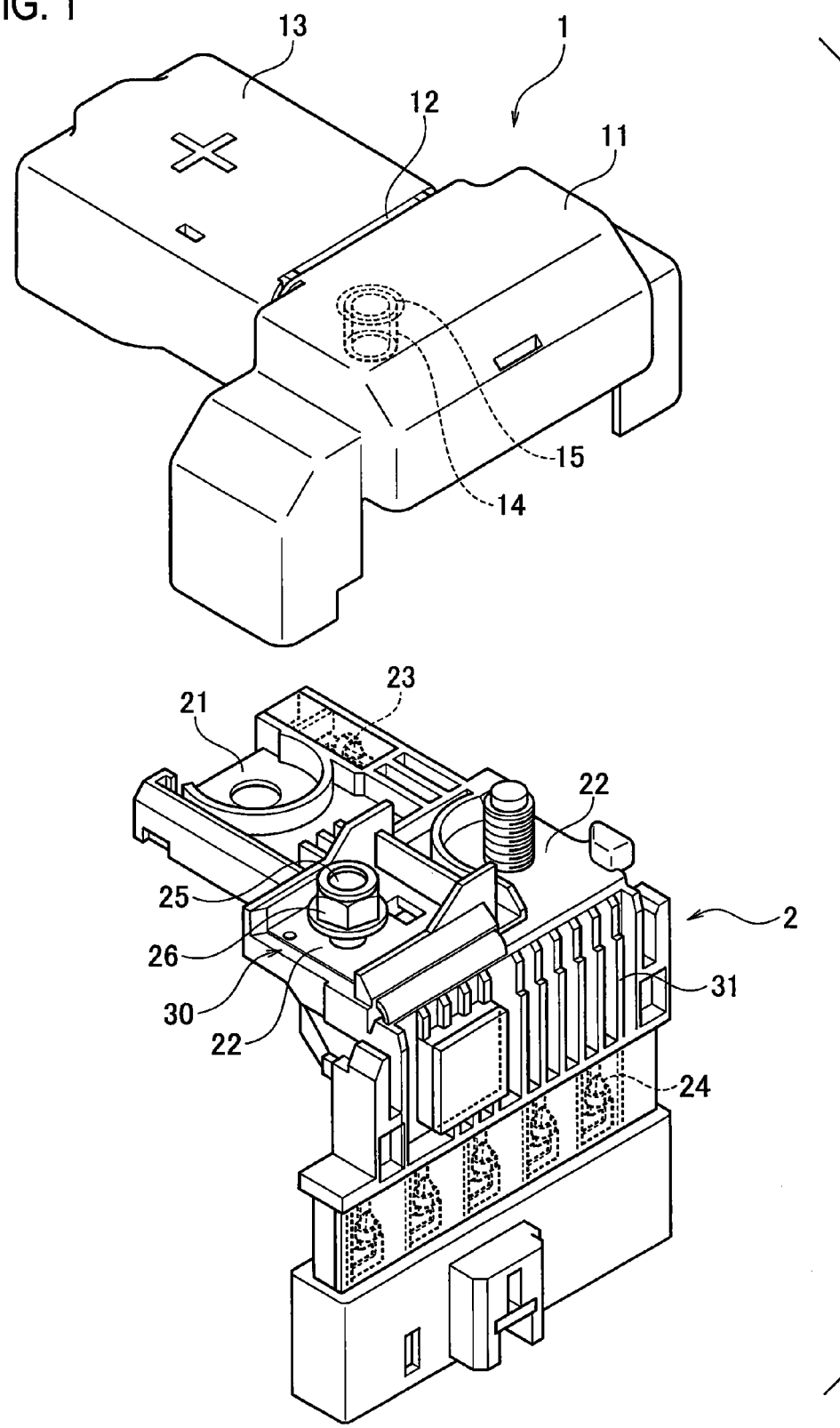
FIG. 1 is an exploded perspective view showing a fuse unit and a cover according to an embodiment of the present invention.
Figure 2:
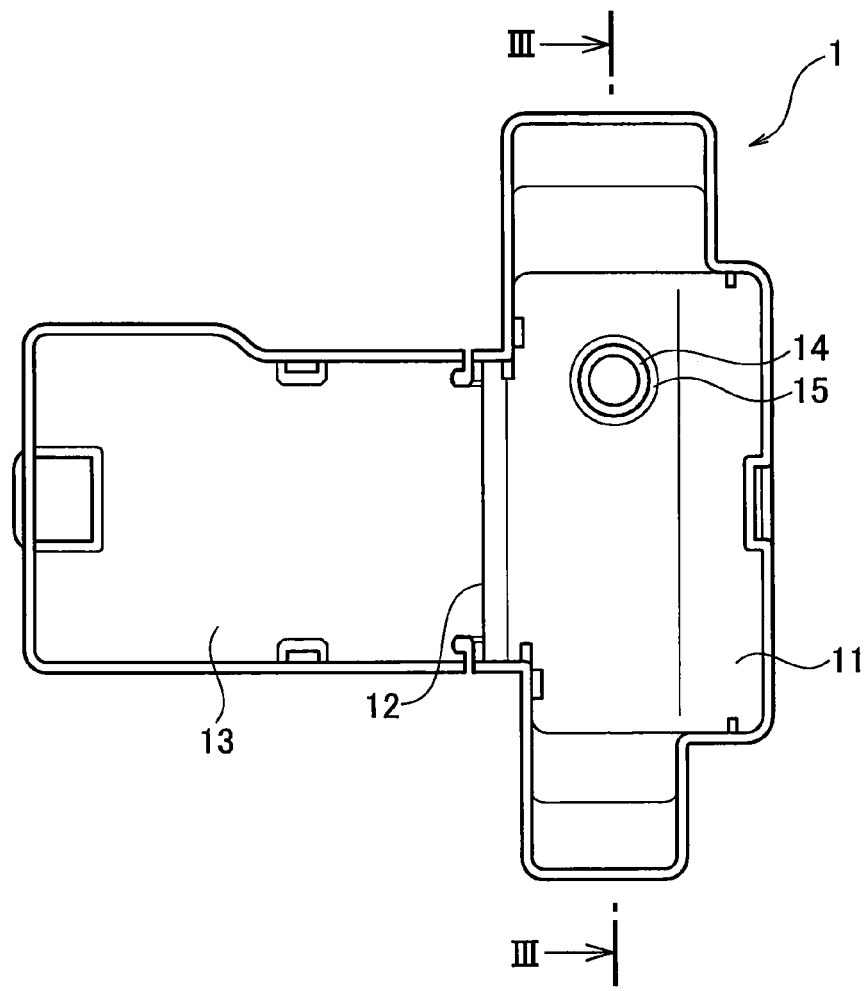
FIG. 2 is a view showing the cover according to the embodiment of the present invention as viewed from below.
Figure 3:
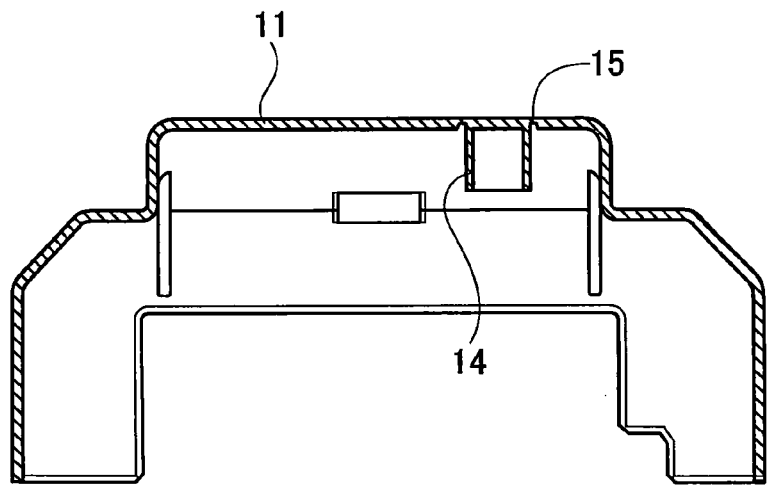
FIG. 3 is a cross-sectional view taken along the line III-III in FIG. 2.
Figure 4:
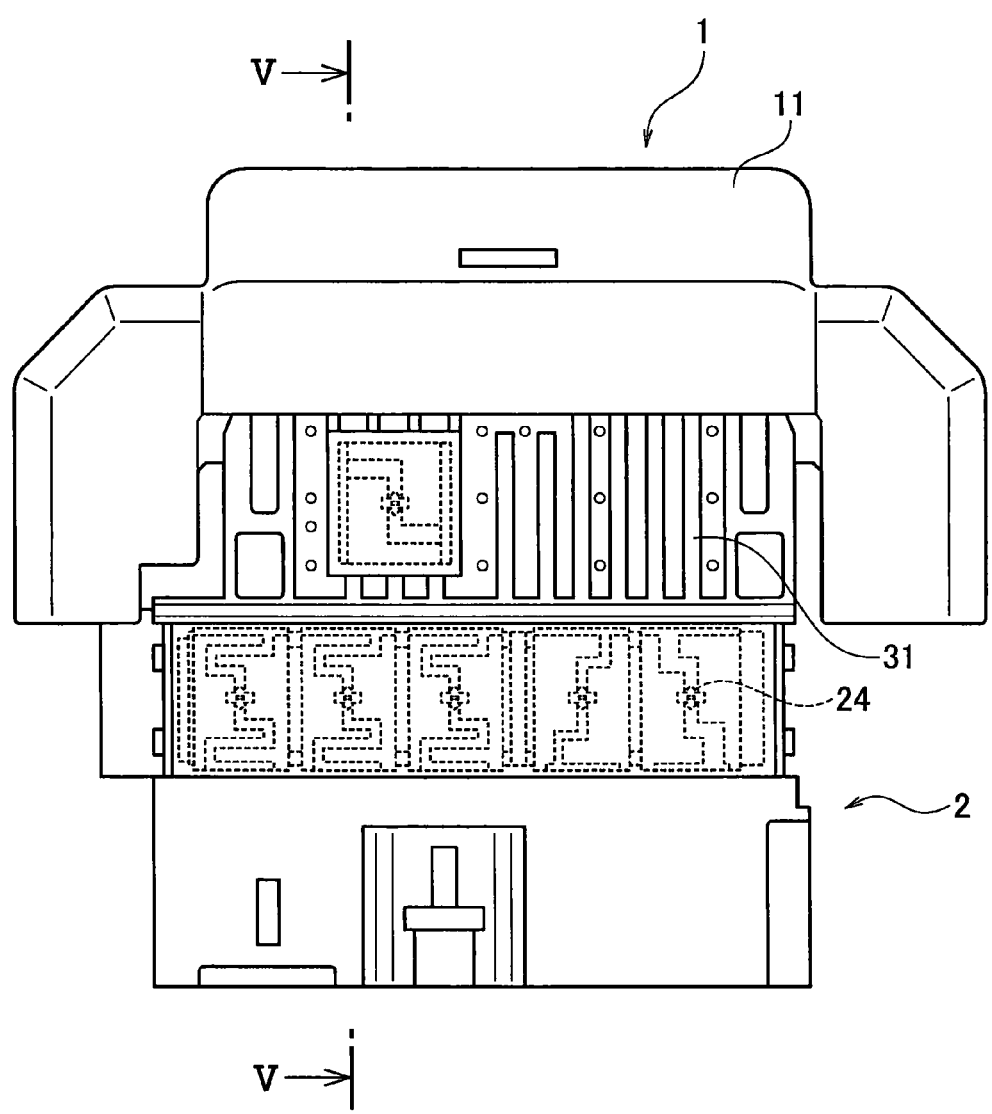
FIG. 4 is a front view of the fuse unit and the cover according to the embodiment of the present invention.

An embodiment of the present invention will be described below with reference to the drawings.

FIG. 1 to FIG. 8 are views each showing the embodiment of the present invention. A cover 1 is attached to the periphery of a fuse unit 2 serving as an electronic device. First, the configuration of the fuse unit 2 will be described below.

The fuse unit 2 having an L-shape is directly attached to a battery of a vehicle (not shown in the figure). The fuse unit 2 includes a busbar 30 and a protection resin portion 31 covering an appropriate part of the busbar 30. The busbar 30 is provided, on the upper surface thereof, with a power supply connecting portion 21 serving as a terminal connecting portion, a plurality of external connecting portions 22 each serving as a terminal connecting portion, and a fusible portion 23 placed between the power supply connecting portion 21 and the external connecting portions 22 and preventing supply of an overcurrent to the external connecting portions 22. The external connecting portions 22 are each connected with an external terminal 20 serving as a fixture component. The busbar 30 is provided, on the side surface thereof, with other fusible portions 24 for preventing supply of an overcurrent to other external connecting portions (not shown in the figure), and an external connecting portion 27 for connector connection. The external connecting portion 27 is connected with an external terminal (not shown in the figure) via a connector connection.

The external connecting portions 22 for bolt connection are provided with bolts 25. The bolts 25 are fixed to the protection resin portion 31 in a manner such that a head portion 25a of each bolt 25 is buried in the protection resin portion 31. The bolts 25 are placed in a manner such that the tip of a screw portion 25b of each bolt 25 faces upward (outward). A nut 26 for fastening one external terminal 20 is screwed onto one bolt 25. The bolt 25 and the nut 26 have a configuration in which the nut 26 is temporarily fixed to the bolt 25.

Figure 5:
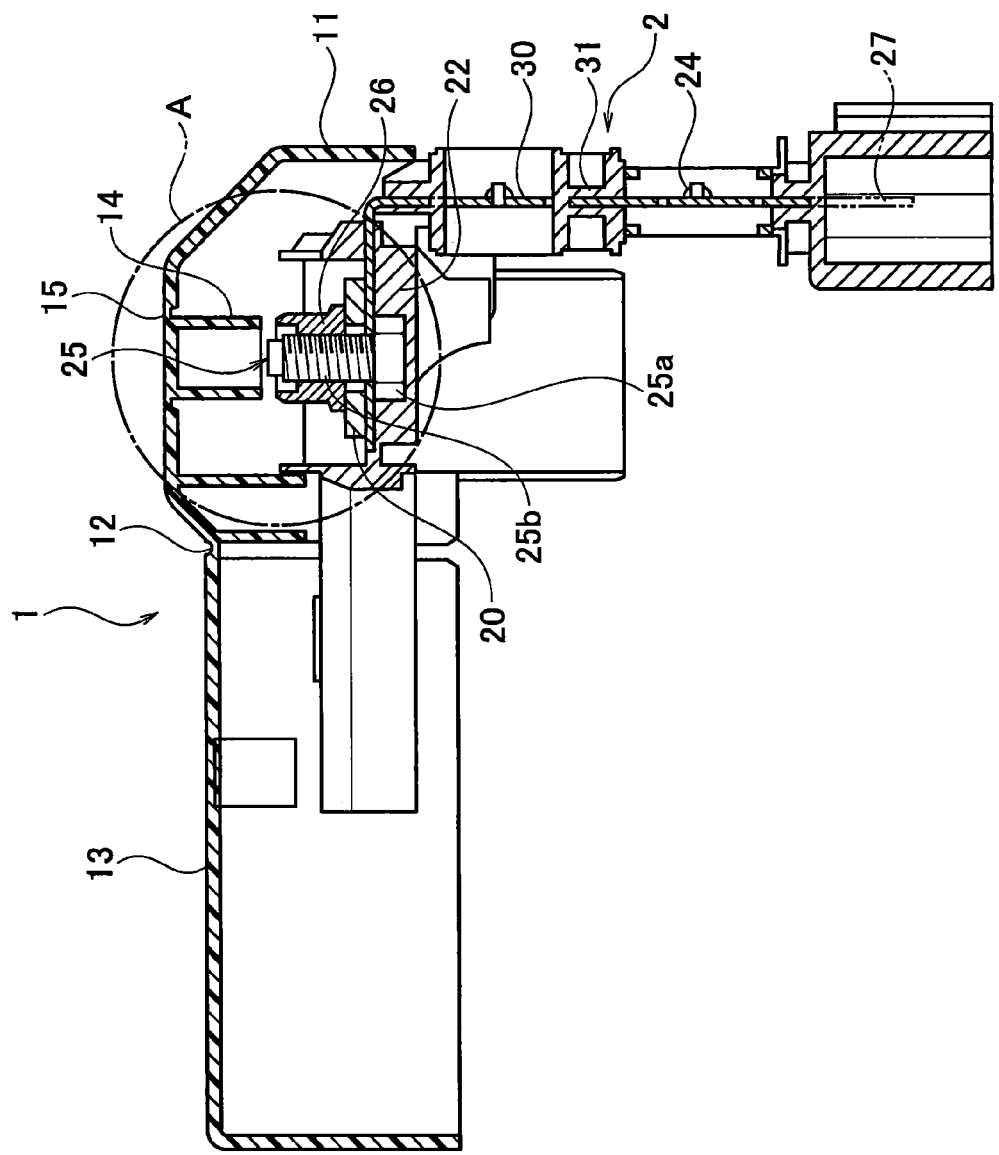
FIG. 5 is a cross-sectional view taken along the line V-V in FIG. 4.
Figure 6:
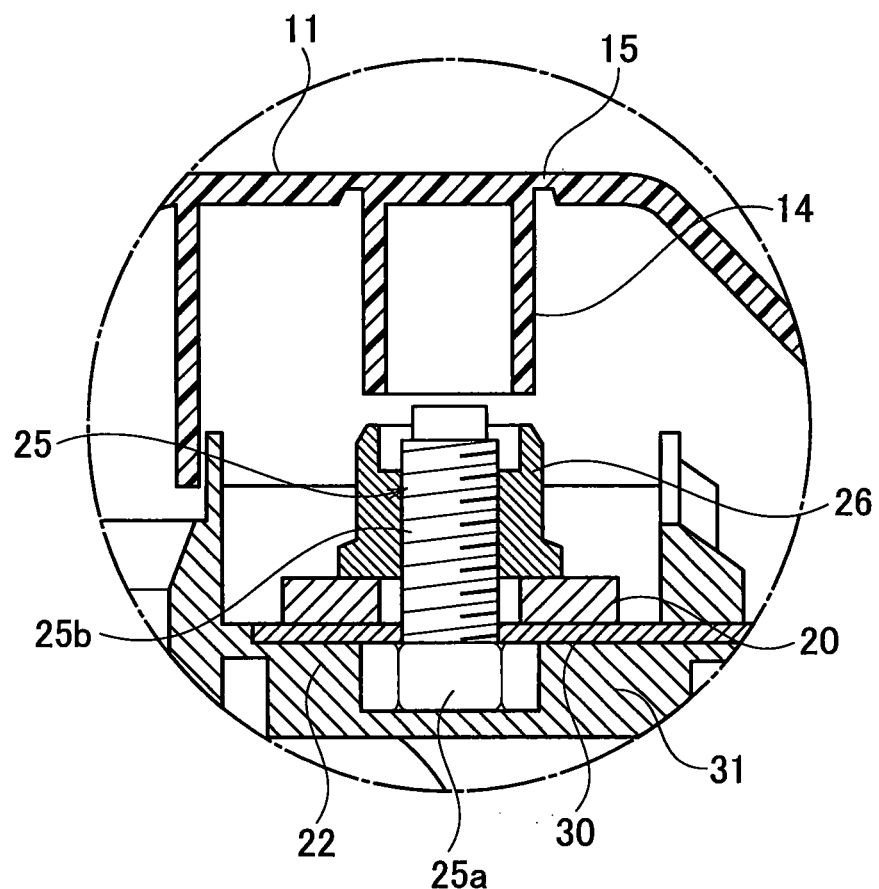
FIG. 6 is an enlarged cross-sectional view of area "A" in FIG. 5.
Figure 7:
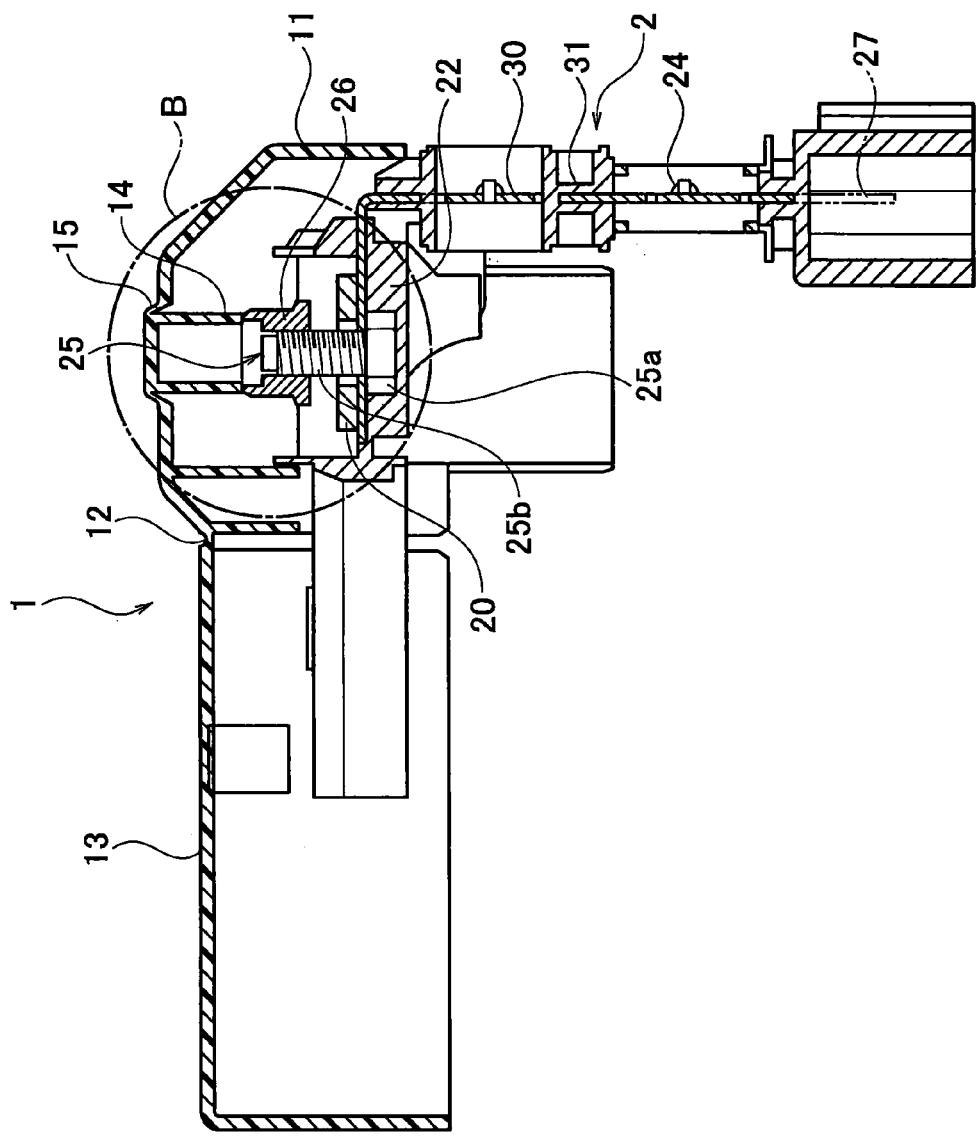
FIG. 7 is a cross-sectional view of the fuse unit and the cover according to the embodiment of the present invention at the time of attachment of the cover with an emission of fastening of the nut.
Figure 8:
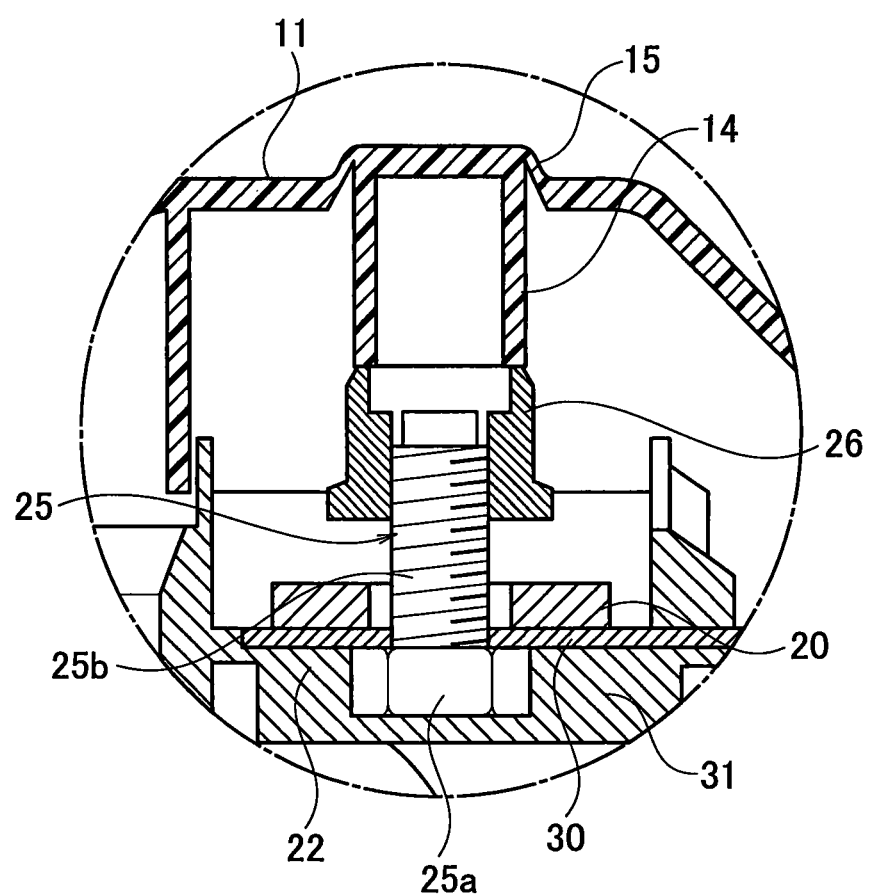
FIG. 8 is an enlarged cross-sectional view of area "B" in FIG. 7 showing a state where a thin portion formed on the circumference of a protrusion is deformed due to interference with the nut.

The cover 1 is made of polypropylene resin (PP resin). The cover 1 covers the fuse unit 2, a battery terminal (not shown in the figure) and a battery post (not shown in the figure). The cover 1 includes a fixed surface portion 11 which is fitted onto the fuse unit 2 by sliding the cover 1 from above, and a lid portion 13 connected to the fixed surface portion 11 via a hinge 12. The fixed surface portion 11 has a cylindrical protrusion 14 protruding downward on the inner side of the fixed surface portion 11 in a position corresponding to the nut 26. The fixed surface portion 11 is further provided with a thin portion 15 formed on the circumference of the protrusion 14. The protrusion 14 has a height set in a manner such that the protrusion 14 does not interfere with the nut 26 located in the fastened position as shown in FIG. 5 and FIG. 6, but interferes with the nut 26 located in another position other than the fastened position as shown in FIG. 7 and FIG. 8.

According to the configuration described above, the cover 1 is fixed to the fuse unit 2 by sliding the cover 1 toward the fuse unit 2 from above and then fitting the fixed surface portion 11 onto the fuse unit 2. When the nut 26 is in a regularly fastened state in which the nut 26 is fastened onto the bolt 25 of the fuse unit 2, the cylindrical protrusion 14 formed on the inner side of the fixed surface portion 11 in the position corresponding to the nut 26 does not interfere with the nut 26, as shown in FIG. 5 and FIG. 6. On the other hand, when the nut 26 is in an incompletely fastened state in which the nut 26 is temporarily fixed to the bolt 25 of the fuse unit 2, the protrusion 14 protruding on the inner side of the fixed surface portion 11 interferes with the nut 26. If the cover 1 is then forcibly attached to the fuse unit 2, the protrusion 14 is pressed upward by the nut 26, as shown in FIG. 7 and FIG. 8. The thin portion 15 is thus subjected to stretch deformation due to this pressure force so that the outer surface of the cover 1 at the portion corresponding to the protrusion 14 protrudes outward. The thin portion 15 subjected to stretch deformation is then whitened (turns to a paler color than other portions), or the thin portion 15 is fractured due to the pressure force. Therefore, an omission of fastening of the nut 26 can be recognized visually. Accordingly, incomplete fastening of the nut 26 can be prevented.

Although the present embodiment exemplified the case where the cover 1 is attached to the fuse unit 2, the cover 1 of the present invention is also applicable to other electronic devices other than the fuse unit 2.

Although the present embodiment exemplified the case where the protrusion 14 has a cylindrical shape, the protrusion 14 may have other shapes (for example, a columnar body having an X-shape in cross section).

Although the present embodiment exemplified the case where the thin portion 15 is formed in a manner such that the fixed surface portion 11 of the cover 1 is recessed on the inner side thereof, the thin portion 15 may be formed in a manner such that the fixed surface portion 11 of the cover 1 is recessed on the outer side or recessed on both the inner side and the outer side thereof. The thin portion 15 is preferably formed in a manner such that the fixed surface portion 11 of the cover 1 is recessed on the inner side, in view of a design aspect, since the outer side of the fixed surface portion 11 can be flat.

What is claimed is:

1. A cover covering an electronic device to which a fixture component is fixed in a manner such that a nut is fastened onto a bolt extending outwardly from the electronic device, the cover comprising:
    a fixed surface portion;
    a protrusion protruding from an inner surface of the fixed surface portion in a position corresponding to the nut and having a height set in a manner such that the protrusion does not interfere with the nut located in a fastened position, but interferes with the nut located in a position other than the fastened position; and
    the fixed surface portion comprises a thin portion that encircles the protrusion, wherein
    the thin portion is subjected to stretch deformation in a condition in which the protrusion interferes with the nut located in the position other than the fastened position.

2. The cover according to claim 1, wherein the thin portion defines a recess around a circumference of a base of the protrusion where the protrusion protrudes from the fixed surface portion.

3. The cover according to claim 1, wherein the thin portion defines a cylindrical recess formed on the inner surface of the fixed surface portion having an cylindrical shape that encircles a base of the protrusion.

4. The cover according to claim 1, wherein the protrusion comprises one of: a cylindrical tubular shape; and a columnar body having an X-shaped cross section.

5. The cover according to claim 1, wherein the protrusion is formed in a cylindrical shape having a height set to form a distance between an end of the cylindrical protrusion and an end of the bolt.

6. The cover according to claim 1, wherein the cover is formed of resin.

7. The cover according to claim 1, wherein the height of the protrusion is set in a manner such that the protrusion: does not interfere with the nut located in a regular fastened position; and interferes with the nut located in an incomplete fastened position.

8. The cover according to claim 1, wherein
    in a state of forcible attachment of the cover to the electronic device, the protrusion is pressed upward by the nut with which the protrusion interferes, and
    the thin portion is subjected to stretch deformation due to a force of the upward pressing such that an outer surface of the fixed surface portion at a portion corresponding to the protrusion protrudes outward.

9. The cover according to claim 8, wherein the thin portion subjected to stretch deformation is whitened due to the force of the upward pressing, such that an incomplete fastened position of the nut can be visually recognized.

10. The cover according to claim 8, wherein the thin portion subjected to stretch deformation is fractured due to the force of the upward pressing, such that an incomplete fastened position of the nut can be visually recognized.

11. The cover according to claim 1, wherein the outer surface of the fixed surface portion opposite the thin portion comprises a flat surface.

12. The cover according to the claim 1, wherein the thin portion defines a recess formed on the inner surface of the fixed surface portion.

13. The cover according to the claim 1, wherein
    the thin portion defines a recess formed on an outer surface of the fixed surface portion.

14. The cover according to the claim 1, wherein
    the thin portion defines a first recess formed on the inner surface of the fixed surface portion and a second recess formed on an outer surface of the fixed surface portion.

* * * * *